United States Patent
Hwang (10) Patent No.: US 11,031,067 B2
(45) Date of Patent: Jun. 8, 2021

(54) SEMICONDUCTOR MEMORY DEVICE FOR SECURING SENSING MARGIN AT CRYOGENIC TEMPERATURE

(71) Applicant: SK hynix Inc., Gyeonggi-do (KR)

(72) Inventor: Mi-Hyun Hwang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/683,926

(22) Filed: Nov. 14, 2019

(65) Prior Publication Data
US 2020/0265889 A1 Aug. 20, 2020

(30) Foreign Application Priority Data

Feb. 15, 2019 (KR) .................. 10-2019-0017843

(51) Int. Cl.
*G11C 7/00* (2006.01)
*G11C 11/406* (2006.01)
*G11C 11/4091* (2006.01)
*G11C 7/08* (2006.01)

(52) U.S. Cl.
CPC .......... *G11C 11/40626* (2013.01); *G11C 7/08* (2013.01); *G11C 11/4091* (2013.01)

(58) Field of Classification Search
CPC .................................. G11C 11/4091
USPC ........................................... 365/205
See application file for complete search history.

(56) References Cited

U.S. PATENT DOCUMENTS

| 2015/0380074 | A1* | 12/2015 | Choi .............. G11C 11/4091 365/189.011 |
| 2018/0061479 | A1* | 3/2018 | Jo .................. G11C 11/40611 |
| 2018/0166120 | A1 | 6/2018 | Ware et al. |
| 2020/0176049 | A1* | 6/2020 | Lee .................. G11C 7/04 |

* cited by examiner

Primary Examiner — Hoai V Ho
(74) Attorney, Agent, or Firm — IP & T Group LLP (57) ABSTRACT

A semiconductor memory device includes a controller for sequentially activating first and second control signals and activating a third control signal during an amplification period, in a pseudo cryogenic temperature, a first driver for driving a first power source line with a first voltage during an initial period of the amplification period, based on the first control signal, a second driver for driving the first power source line with a second voltage during a later period of the amplification period, based on the second control signal, a third driver for driving a second power source line with a third voltage during the amplification period, based on the third control signal, and a sense amplifier for primarily amplifying a voltage difference between a data line pair using the first and third voltages during the initial period, and secondarily amplifying the difference using the second and third voltages during the later period.

16 Claims, 4 Drawing Sheets

SEMICONDUCTOR MEMORY DEVICE FOR SECURING SENSING MARGIN AT CRYOGENIC TEMPERATURE

CROSS-REFERENCE TO RELATED APPLICATION

This application claims priority under 35 U.S.C. § 119 to Korean Patent Application No. 10-2019-0017843, filed on Feb. 15, 2019, the disclosure of which is incorporated herein by reference in its entirety.

BACKGROUND

1. Field

Various embodiments of the present invention relate to a semiconductor design technique, and more particularly, to a semiconductor memory device.

2. Description of the Related Art

MOS transistors operate according to threshold voltages. Such threshold voltages are likely to rise as temperature drops below room temperature. In other words, characteristics of MOS transistors tend to become worse below room temperature. In a semiconductor memory device such as a DRAM, sense amplifiers are used for sensing and amplifying data stored in memory cells. As characteristics of MOS transistors becomes worse, an offset of the sense amplifiers may increase, thus degrading a sensing margin of the sense amplifiers.

To resolve such concern, a low-temperature transistor may be used. However, since the low-temperature transistor cannot be used at room temperature, such transistor is not well suited for general use. While integrating both low-temperature transistors and room-temperature transistors in a single chip is possible, doing so increases the processing cost.

Recently, semiconductor memory devices operating at cryogenic temperature have been developed. For example, a DRAM operating at a cryogenic temperature includes memory cells having longer data retention time than those of a DRAM operating at room temperature. Therefore, the DRAM operating at cryogenic temperature rarely performs a refresh operation or has a longer refresh period, whereby power consumption is reduced.

SUMMARY

Various embodiments of the present invention are directed to a semiconductor memory device that may secure a sensing margin at a cryogenic temperature.

Also, various embodiments of the present invention are directed to a semiconductor memory device that may reduce current consumption while securing a sensing margin at the cryogenic temperature.

Also, various embodiments of the present invention are directed to a semiconductor memory device with more general usability, including use at room temperature and at a cryogenic temperature.

In accordance with an embodiment, a semiconductor memory device includes: a controller suitable for sequentially activating a first control signal and a second control signal during an amplification period and activating a third control signal during the amplification period, when operating in a temperature range including a pseudo cryogenic temperature; a first driver suitable for driving a first power source line with a first voltage during an initial period of the amplification period, based on the first control signal; a second driver suitable for driving the first power source line with a second voltage higher than the first voltage during a later period of the amplification period, based on the second control signal; a third driver suitable for driving a second power source line with a third voltage during the amplification period, based on the third control signal; and a sense amplifier coupled between the first and second power source lines, and suitable for primarily amplifying a voltage difference between a data line pair using the first and third voltages during the initial period, and secondarily amplifying the voltage difference using the second and third voltages during the later period, when operating in the temperature range.

The temperature range may be 77K±7K.

The first and second voltages may be a first high voltage and a second high voltage, respectively, and the third voltage may be a low voltage.

The semiconductor memory device may further include a memory cell coupled to the data line pair, and the data line pair may include a bit line pair.

The semiconductor memory device may further include a temperature sensor suitable for sensing temperatures in the temperature range.

In accordance with an embodiment, a semiconductor memory device includes: a controller suitable for activating a first control signal during an amplification period when operating in a first temperature range including room temperature, sequentially activating the first control signal and a second control signal during the amplification period when operating in a second temperature range including a pseudo cryogenic temperature, and activating a third control signal in common during the amplification period when operating in the first and second temperature ranges; a first driver suitable for driving a first power source line with a first voltage based on the first control signal; a second driver suitable for driving the first power source line with a second voltage higher than the first voltage based on the second control signal; a third driver suitable for driving a second power source line with a third voltage based on the third control signal; and a sense amplifier coupled between the first and second power source lines, and suitable for amplifying a voltage difference between a data line pair using the first and third voltages during the amplification period when operating in the first temperature range, and primarily amplifying the voltage difference using the first and third voltages during an initial period of the amplification period, and secondarily amplifying the voltage difference using the second and third voltages during the later period of the amplification period when operating in the second temperature range.

The second temperature range may be 77K±7K.

The first and second voltages may be a first high voltage and a second high voltage, respectively, and the third voltage may be a low voltage.

The semiconductor memory device may further include a memory cell coupled to the data line pair, and the data line pair may include a bit line pair.

The semiconductor memory device may further include a temperature sensor suitable for sensing the first and second temperature ranges, and generating a temperature flag signal corresponding to the sense result, and the controller may generate the first to third control signals based on the temperature flag signal, an active signal and a precharge signal.

In accordance with an embodiment, a semiconductor memory device includes: a controller suitable for activating a first control signal during an amplification period when operating in a first temperature range including room temperature, activating a second control signal during the amplification period when operating in a second temperature range including a pseudo cryogenic temperature, and activating a third control signal in common during the amplification period when operating in the first and second temperature ranges; a first driver suitable for driving a first power source line with a first voltage based on the first control signal; a second driver suitable for driving the first power source line with a second voltage higher than the first voltage based on the second control signal; a third driver suitable for driving a second power source line with a third voltage based on the third control signal; and a sense amplifier coupled between the first and second power source lines, and suitable for amplifying a voltage difference between a data line pair using the first and third voltages during the amplification period when operating in the first temperature range, and amplifying the voltage difference using the second and third voltages during the amplification period when operating in the second temperature range.

The second temperature range may be 77K±7K.

The first and second voltages may be a first high voltage and a second high voltage, respectively, and the third voltage may be a low voltage.

The semiconductor memory device may further include a memory cell coupled to the data line pair, and the data line pair may include a bit line pair.

The semiconductor memory device may further include a temperature sensor suitable for sensing the first and second temperature ranges, and generating a temperature flag signal corresponding to the sense result, and the controller may generate the first to third control signals based on the temperature flag signal, an active signal and a precharge signal.

In accordance with an embodiment, a semiconductor memory device includes: a sense amplifier suitable for amplifying a voltage difference between a data line pair by using voltages supplied through a pull-up voltage line and a pull-down voltage line; a first driver suitable for driving the pull-up voltage line with a first pull-up voltage; a second driver suitable for driving the pull-up voltage line, when operating in a pseudo-cryogenic temperature range, with a second pull-up voltage that is higher than the first pull-up voltage; and a third driver suitable for driving the pull-up voltage line with a pull-down voltage during an amplification period.

When operating at a temperature higher than the pseudo-cryogenic temperature range, the first driver may be enabled during the amplification period, and when operating in the pseudo-cryogenic temperature range, the second driver may be enabled during the amplification period.

When operating in the pseudo-cryogenic temperature range, the first driver may be enabled during an initial portion of the amplification period, and then the first driver may be disabled and the second driver may be enabled during a later portion of the amplification period.

DETAILED DESCRIPTION

Various embodiments of the present invention are described below in more detail with reference to the accompanying drawings. These embodiments are provided so that this disclosure is thorough and complete, and fully conveys the scope of the present invention to those skilled in the art. Throughout the disclosure, like reference numerals refer to like parts throughout the various figures and embodiments of the present invention.

Also, throughout the specification, reference to "an embodiment," "another embodiment" or the like does not necessarily mean only one embodiment, and different references to any such phrase are not necessarily to the same embodiment(s).

It will be understood that, although the terms "first", "second", "third", and the like may be used herein to identify various elements, these elements are not limited by these terms. These terms are used to distinguish one element from another element that otherwise have the same or similar names. Thus, a first element in one instance may be termed second element in another instance without departing from the spirit and scope of the present invention.

It will be further understood that open-ended terms, such as "comprises," "comprising," "includes" and "including," when used in this specification, specify the presence of the stated elements but do not preclude the presence or addition of one or more other elements. As used herein, the term "and/or" includes any and all combinations of one or more of the associated listed items.

As used herein, singular forms may include the plural forms and vice versa, unless the context clearly indicates otherwise. The articles 'a' and 'an' as used in this application and the appended claims should generally be construed to mean 'one or more' unless specified otherwise or clear from context to be directed to a singular form.

A cryogenic temperature in accordance with embodiments may be any temperature in a first temperature range of 77K±7K, which is a range in which a CMOS device can operate. Hereinafter, such cryogenic temperature is referred to as a "pseudo-cryogenic temperature".

Room temperature in accordance with embodiments may be any temperature in a second temperature range, which is higher than the temperature range of the pseudo-cryogenic temperature.

Figure 1:
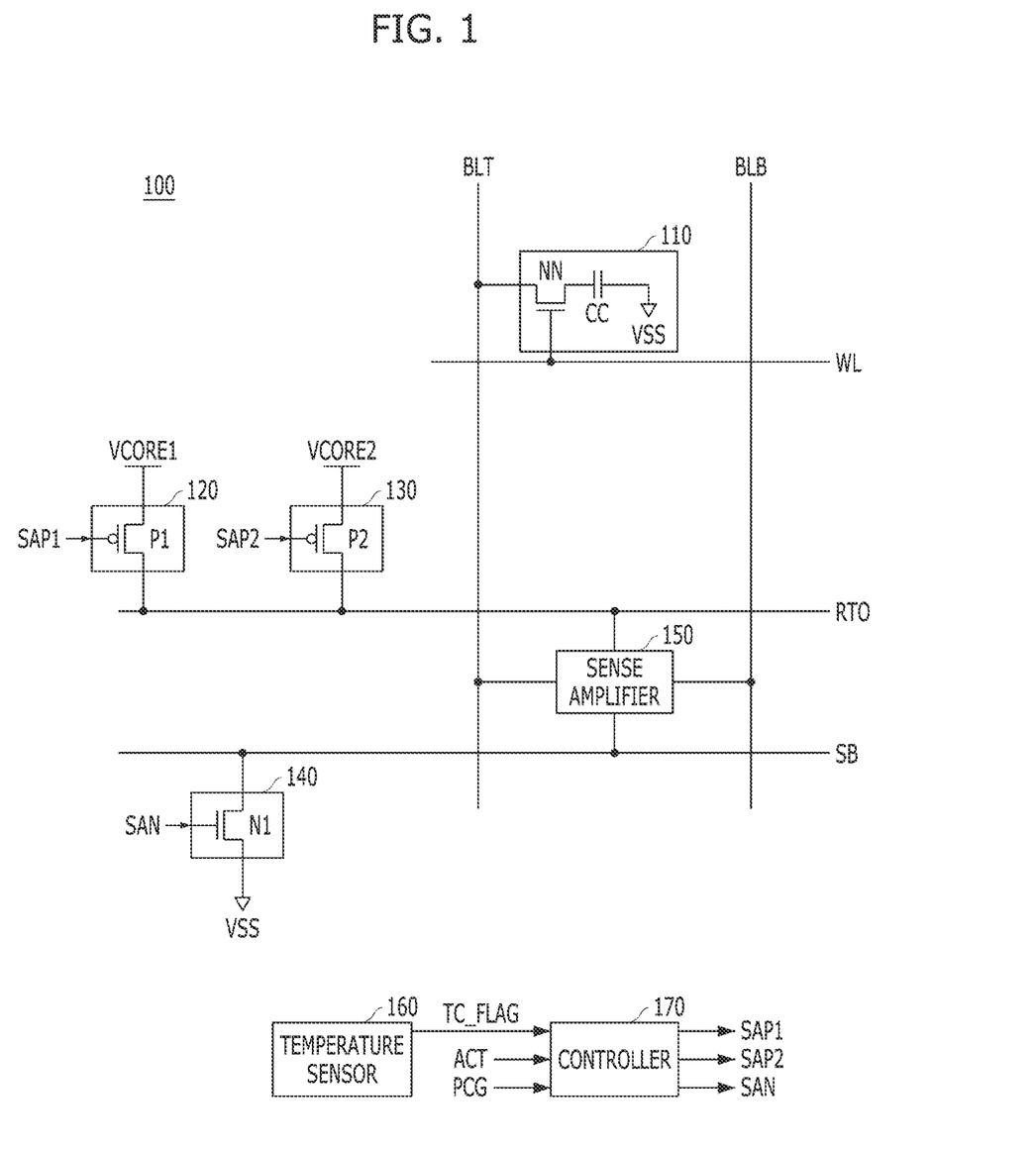
FIG. 1 is a block diagram illustrating a semiconductor memory device in accordance with an embodiment of the present invention.

FIG. 1 is a block diagram illustrating a semiconductor memory device 100 in accordance with an embodiment the present invention.

Referring to FIG. 1, the semiconductor memory device 100 may include a memory cell 110, a first driver 120, a second driver 130, a third driver 140, a sense amplifier 150, a temperature sensor 160 and a controller 170.

The memory cell 110 may be coupled to a bit line pair BLT and BLB and a word line WL. For example, the memory cell 110 may be coupled to the bit line BLT and the word line WL. The memory cell 110 may be selected according to a voltage applied through the word line WL, and write or read data loaded onto the bit line pair BLT and BLB when selected. For example, the memory cell 110 may include an NMOS transistor NN as a selection switch and a capacitor CC as a 1-bit storage.

The first driver 120 may drive a first power source line (i.e., a pull-up voltage line) RTO with a first high voltage (i.e., a first pull-up voltage) VCORE1 based on a first control signal SAP1. The first driver 120 may be enabled during an amplification period tSA at room temperature, and drive the first power source line RTO with the first high voltage VCORE1. At a pseudo-cryogenic temperature, the first driver 120 may be disabled during the amplification period tSA. Alternatively, at the pseudo-cryogenic temperature, the first driver 120 may be enabled to drive the first power source line RTO with the first high voltage VCORE1 during an initial period tA of the amplification period tSA, and then enabled during a later period tB of the amplification period tSA. For example, the first driver 120 may include a PMOS transistor P1.

The second driver 130 may drive the first power source line RTO with a second high voltage (i.e., a second pull-up voltage line) VCORE2 based on a second control signal SAP2. The second high voltage VCORE2 may be higher than the first high voltage VCORE1 and lower than a set voltage, which may be predetermined. The set voltage may be set in consideration of a turn-on condition of the NMOS transistor NN included in the memory cell 110. At room temperature, the second driver 130 may be disabled during the amplification period tSA. At a pseudo-cryogenic temperature, the second driver 130 may be enabled to drive the first power source line RTO with the second high voltage VCORE2 during the amplification period tSA. Alternatively, at the pseudo-cryogenic temperature, the second driver 130 may be disabled during the initial period tA of the amplification period tSA, and enabled and drive the first power source line RTO with the second high voltage VCORE2 during the later period tB of the amplification period tSA. For example, the second driver 130 may include a PMOS transistor P2.

The third driver 140 may drive a second power source line (i.e., a pull-down voltage line) SB with a low voltage (i.e., a pull-down voltage) VSS based on a third control signal SAN. For example, the low voltage VSS may be a ground voltage. At room temperature and a pseudo-cryogenic temperature, the third driver 140 may drive the second power source line SB with the low voltage VSS during the amplification period tSA. In other words, the third driver 140 may be enabled in common at room temperature and the pseudo-cryogenic temperature. For example, the third driver 140 may include an NMOS transistor N1.

The sense amplifier 150 may be coupled between the first and second power source lines RTO and SB and between the bit line pair BLT and BLB. At room temperature, the sense amplifier 150 may amplify a voltage difference between the bit line pair BLT and BLB, using the first high voltage VCORE1 and the low voltage VSS during the amplification period tSA. At a pseudo-cryogenic temperature, the sense amplifier 150 may amplify the voltage difference between bit line pair BLT and BLB, using the second high voltage VCORE2 and the low voltage VSS during the amplification period tSA. Alternatively, at the pseudo-cryogenic temperature, the sense amplifier 150 may primarily amplify the voltage difference between the bit line pair BLT and BLB, using the first high voltage VCORE1 and the low voltage VSS during the initial period to of the amplification period tSA, and then secondarily amplify the voltage difference between the bit line pair BLT and BLB, using the second high voltage VCORE2 and the low voltage VSS during the later period tB of the amplification period tSA. For example, the sense amplifier 150 may include a latch-type sense amplifier.

The temperature sensor 160 has a relatively wide sensing range and thus may sense any temperature within the first temperature range including a pseudo-cryogenic temperature as well as any temperature within the second temperature range including room temperature. The temperature sensor 160 may generate a temperature flag signal TC_FLAG corresponding to the temperature sensed or in which range the sensed temperature falls. The temperature flag signal TC_FLAG may include a single bit signal or a multi-bit signal. For example, the temperature flag signal TC_FLAG may have a logic low level (or a logic high level) at room temperature and a logic high level (or a logic low level) at a cryogenic temperature.

The controller 170 may generate the first to third control signals SAP1, SAP2 and SAN based on the temperature flag signal TC_FLAG, an active signal ACT and a precharge signal PCG. At room temperature, the controller 170 may activate the first control signal SAP1 and deactivate the second control signal SAP2 during the amplification period tSA. At a pseudo-cryogenic temperature, the controller 170 may deactivate the first control signal SAP1 and activate the second control signal SAP2 during the amplification period tSA. Alternatively, at the pseudo-cryogenic temperature, the controller 170 may activate the first control signal SAP1 and deactivate the second control signal SAP2 during the initial period to of the amplification period tSA, and deactivate the first control signal SAP1 and activate the second control signal SAP2 during the later period tB of the amplification period tSA. In other words, at the pseudo-cryogenic temperature, the controller 170 may activate only the second control signal SAP2 of the first and second control signals SAP1 and SAP2 during the amplification period tSA, or sequentially activate the first and second control signals SAP1 and SAP2 during the amplification period tSA. At room temperature and the pseudo-cryogenic temperature, the controller 170 may activate the third control signal SAN in common during the amplification period tSA.

An operation of the semiconductor memory device 100 having the aforementioned structure in accordance with an embodiment is described below with reference to FIGS. 2 to 4.

Figure 2:
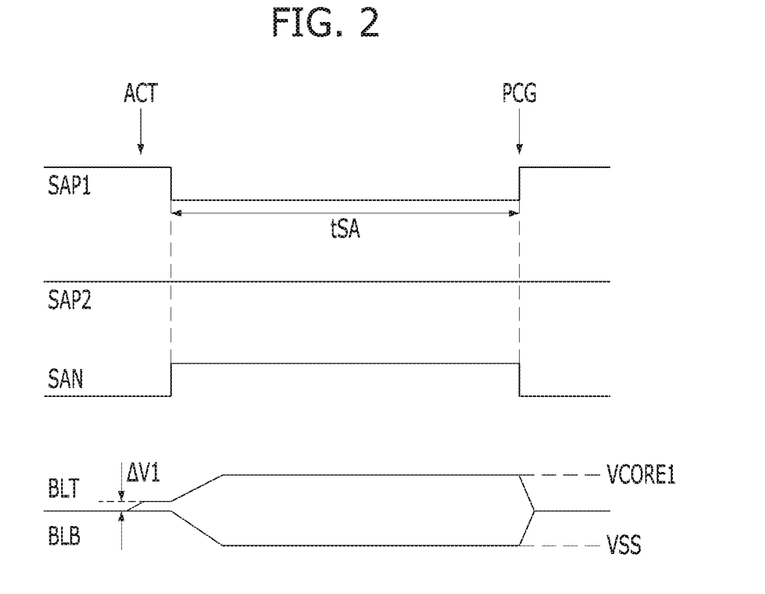
FIG. 2 is a timing diagram for describing an example of an operation of a semiconductor memory device, such as that shown in FIG. 1, at room temperature.

FIG. 2 is a timing diagram for describing an example of an operation of the semiconductor memory device 100 at room temperature.

Referring to FIG. 2, the temperature sensor 160 may generate the temperature flag signal TC_FLAG corresponding to room temperature. For example, the temperature sensor 160 may generate the temperature flag signal TC_FLAG having a logic low level at room temperature.

When the active signal ACT is activated, the memory cell 110 is selected according to the voltage applied through the word line WL. Accordingly, a voltage difference ΔV1 occurs between the bit line BLT and the bit line bar BLB while charge sharing occurs between the bit line BLT of the bit line pair BLT and BLB and the memory cell 110.

The controller 170 may generate the first to third control signals SAP1, SAP2 and SAN based on the temperature flag signal TC_FLAG, the active signal ACT and the precharge signal PCG. For example, at room temperature, the controller 170 may activate the first and third control signals SAP1 and SAN and deactivate the second control signal SAP2, during the amplification period tSA.

The first driver 120 may drive the first power source line RTO with the first high voltage VCORE1 based on the activated first control signal SAP1 during the amplification period tSA. The third driver 140 may drive the second power source line SB with the low voltage VSS based on the activated third control signal SAN during the amplification period tSA. At this time, the second driver 130 may be disabled based on the deactivated second control signal SAP2 during the amplification period tSA.

The sense amplifier 150 may amplify the voltage difference ΔV1 between the bit line pair BLT and BLB, using the first high voltage VCORE1 and the low voltage VSS during the amplification period tSA.

Figure 3:
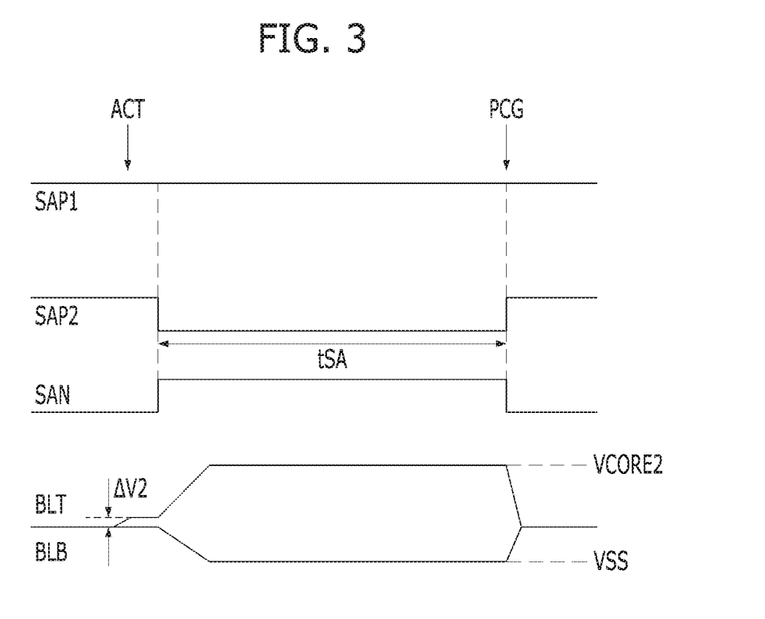
FIG. 3 is a timing diagram for describing an example of an operation of a semiconductor memory device, such as that shown in FIG. 1, at a pseudo-cryogenic temperature.

FIG. 3 is a timing diagram for describing an example of an operation of the semiconductor memory device 100 at a cryogenic temperature.

Referring to FIG. 3, the temperature sensor 160 may generate the temperature flag signal TC_FLAG corresponding to the pseudo-cryogenic temperature. For example, the temperature sensor 160 may generate the temperature flag signal TC_FLAG having a logic high level at the pseudo-cryogenic temperature.

When the active signal ACT is activated, the memory cell 110 is selected according to the voltage applied through the word line WL. Accordingly, a voltage difference ΔV2 occurs between the bit line BLT and the bit line bar BLB while charge sharing occurs between the bit line BLT of the bit line pair BLT and BLB and the memory cell 110.

The controller 170 may generate the first to third control signals SAP1, SAP2 and SAN based on the temperature flag signal TC_FLAG, the active signal ACT and the precharge signal PCG. For example, at the pseudo-cryogenic temperature, the controller 170 may activate the second and third control signals SAP2 and SAN and deactivate the first control signal SAP1, during the amplification period tSA.

The second driver 130 may drive the first power source line RTO with the second high voltage VCORE2 based on the activated second control signal SAP2 during the amplification period tSA. The third driver 140 may drive the second power source line SB with the low voltage VSS based on the activated third control signal SAN during the amplification period tSA. The first driver 120 may be disabled based on the deactivated first control signal SAP1 during the amplification period tSA.

The sense amplifier 150 may amplify the voltage difference ΔV2 between the bit line pair BLT and BLB, using the second high voltage VCORE2 and the low voltage VSS during the amplification period tSA.

Figure 4:
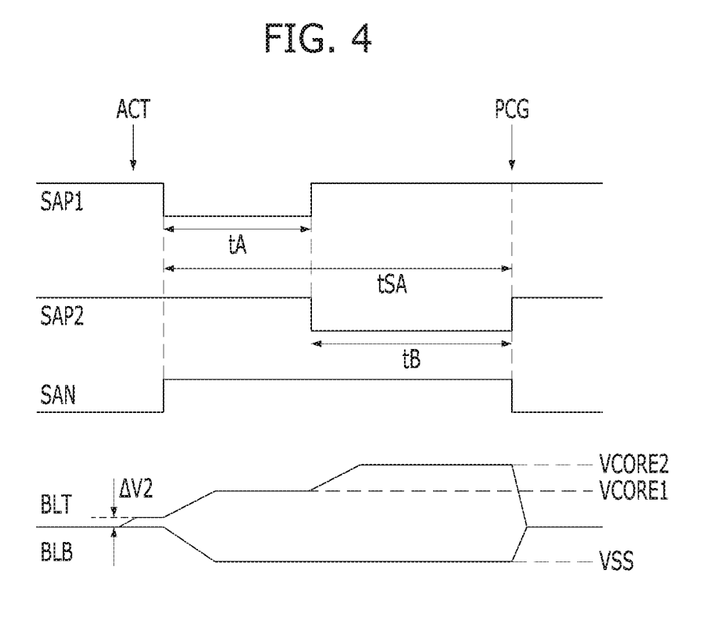
FIG. 4 is a timing diagram for describing another example of an operation of a semiconductor memory device, such as that shown in FIG. 1, at a pseudo-cryogenic temperature.

FIG. 4 is a timing diagram for describing another example of an operation of the semiconductor memory device 100 at the cryogenic temperature.

Referring to FIG. 4, the temperature sensor 160 may generate the temperature flag signal TC_FLAG corresponding to the pseudo-cryogenic temperature. For example, the temperature sensor 160 may generate the temperature flag signal TC_FLAG having a logic high level at the pseudo-cryogenic temperature.

When the active signal ACT is activated, the memory cell 110 is selected according to the voltage applied through the word line WL. Accordingly, a voltage difference ΔV2 occurs between the bit line BLT and the bit line bar BLB while charge sharing occurs between the bit line BLT of the bit lines BLT and BLB and the memory cell 110.

The controller 170 may generate the first to third control signals SAP1, SAP2 and SAN based on the temperature flag signal TC_FLAG, the active signal ACT and the precharge signal PCG. For example, at the pseudo-cryogenic temperature, the controller 170 may activate the first control signal SAP1 and deactivate the second control signal SAP2 during the initial period to of the amplification period tSA, and deactivate the first control signal SAP1 and activate the second control signal SAP2 during the later period tB of the amplification period tSA. The controller 170 may activate the third control signal SAN during the amplification period tSA at the pseudo-cryogenic temperature.

The first driver 120 may drive the first power source line RTO with the first high voltage VCORE1 based on the activated first control signal SAP1 during the initial period tA, and be disabled based on the deactivated first control signal SAP1 during the later period Tb. The second driver 130 may be disabled based on the deactivated second control signal SAP2 during the initial period tA, and drive the second power source line SB with the second high voltage VCORE2 based on the activated second control signal SAP2 during the later period tB. The third driver 140 may drive the second power source line SB with the low voltage VSS based on the activated third control signal SAN during the amplification period tSA.

The sense amplifier 150 may primarily amplify the voltage difference ΔV2 between the bit line pair BLT and BLB, using the first high voltage VCORE1 and the low voltage VSS during the initial period tA, and then secondarily amplify the voltage difference between the bit line pair BLT and BLB, using the second high voltage VCORE2 and the low voltage VSS during the later period tB.

The operations described above with reference to FIGS. 2 to 4 may be performed in a specific mode. For example, the specific mode may include read, write and refresh modes. Particularly, the operations performed at the pseudo-cryogenic temperature (the operations of FIGS. 3 and 4) may have the following features. When the operations at the pseudo-cryogenic temperature (the operations of FIGS. 3 and 4) are performed in the write mode, the data loaded onto the bit line BLT, that is, the data amplified with the second high voltage VCORE2, may be written to the memory cell 110. When charge sharing occurs between the memory cell 110 and the bit line BLT in a subsequent mode, e.g., the read mode, the write mode, or the refresh mode, the bit line pair BLT and BLB may have the second voltage difference ΔV2 greater than the first voltage difference ΔV1. Therefore, since the second voltage difference ΔV2 that is greater than the first voltage difference ΔV1 occurs between the bit line pair BLT and BLB even though an offset of the sense amplifier 150 increases at the pseudo-cryogenic temperature, a sensing margin of the sense amplifier 150 can be improved.

As is apparent from the above description, in a semiconductor memory device in accordance with embodiments, a sensing margin at a pseudo-cryogenic temperature can be improved, and a first high voltage having a low level and a second high voltage having a high level can be selectively used at both room temperature and at a pseudo-cryogenic temperature when the sensing margin is improved.

In accordance with embodiments, as a sensing margin is improved at a cryogenic temperature, operational reliability of the semiconductor memory device can be improved.

Also, in accordance with embodiments, when the sensing margin is improved, first and second currents are selectively used so that current consumption can be reduced.

Furthermore, in accordance with embodiments, the semiconductor memory device has general usability, which may be used at room temperature and at a cryogenic temperature, and thus has excellent price competitiveness.

While the present invention has been illustrated and described with respect to specific embodiments, the disclosed embodiments are not intended to be restrictive. Further, it is noted that the present invention may be achieved in various ways through substitution, change, and modification, as those skilled in the art will recognize in light of the present disclosure, without departing from the spirit and/or scope of the present disclosure. The present invention is intended to embrace all such substitutions, changes and modifications that fall within the scope of the following claims.

What is claimed is:

1. A semiconductor memory device comprising:
   a controller suitable for sequentially activating a first control signal and a second control signal during an amplification period and activating a third control signal during the amplification period, when operating in a temperature range including a pseudo cryogenic temperature;
   a first driver suitable for driving a first power source line with a first voltage during an initial period of the amplification period, based on the first control signal;
   a second driver suitable for driving the first power source line with a second voltage higher than the first voltage during a later period of the amplification period, based on the second control signal;
   a third driver suitable for driving a second power source line with a third voltage during the amplification period, based on the third control signal; and
   a sense amplifier coupled between the first and second power source lines, and suitable for primarily amplifying a voltage difference between a data line pair using the first and third voltages during the initial period, and secondarily amplifying the voltage difference using the second and third voltages during the later period, when operating in the temperature range.

2. The semiconductor memory device of claim 1, wherein the temperature range is 77K±7K.

3. The semiconductor memory device of claim 1, wherein the first and second voltages are a first high voltage and a second high voltage, respectively, and the third voltage is a low voltage.

4. The semiconductor memory device of claim 1, further comprising a memory cell coupled to the data line pair, wherein the data line pair includes a bit line pair.

5. The semiconductor memory device of claim 1, further comprising a temperature sensor suitable for sensing temperatures in the temperature range.

6. A semiconductor memory device comprising:
   a controller suitable for activating a first control signal during an amplification period when operating in a first temperature range including room temperature, sequentially activating the first control signal and a second control signal during the amplification period when operating in a second temperature range including a pseudo cryogenic temperature, and activating a third control signal in common during the amplification period when operating in the first and second temperature ranges;
   a first driver suitable for driving a first power source line with a first voltage based on the first control signal;
   a second driver suitable for driving the first power source line with a second voltage higher than the first voltage based on the second control signal;
   a third driver suitable for driving a second power source line with a third voltage based on the third control signal; and
   a sense amplifier coupled between the first and second power source lines, and suitable for amplifying a voltage difference between a data line pair using the first and third voltages during the amplification period when operating in the first temperature range, and primarily amplifying the voltage difference using the first and third voltages during an initial period of the amplification period, and secondarily amplifying the voltage difference using the second and third voltages during the later period of the amplification period when operating in the second temperature range.

7. The semiconductor memory device of claim 6, wherein the second temperature range is 77K±7K.

8. The semiconductor memory device of claim 6, wherein the first and second voltages are a first high voltage and a second high voltage, respectively, and the third voltage is a low voltage.

9. The semiconductor memory device of claim 6, further comprising a memory cell coupled to the data line pair, wherein the data line pair includes a bit line pair.

10. The semiconductor memory device of claim 6, further comprising a temperature sensor suitable for sensing the first and second temperature ranges, and generating a temperature flag signal corresponding to the sense result,
    wherein the controller generates the first to third control signals based on the temperature flag signal, an active signal and a precharge signal.

11. A semiconductor memory device comprising:
    a controller suitable for activating a first control signal during an amplification period when operating in a first temperature range including room temperature, activating a second control signal during the amplification period when operating in a second temperature range including a pseudo cryogenic temperature, and activating a third control signal in common during the amplification period when operating in the first and second temperature ranges;
    a first driver suitable for driving a first power source line with a first voltage based on the first control signal;
    a second driver suitable for driving the first power source line with a second voltage higher than the first voltage based on the second control signal;
    a third driver suitable for driving a second power source line with a third voltage based on the third control signal; and
    a sense amplifier coupled between the first and second power source lines, and suitable for amplifying a voltage difference between a data line pair using the first and third voltages during the amplification period when operating in the first temperature range, and amplifying the voltage difference using the second and third voltages during the amplification period when operating in the second temperature range.

12. The semiconductor memory device of claim 11, wherein the second temperature range is 77K±7K.

13. The semiconductor memory device of claim 11, wherein the first and second voltages are a first high voltage and a second high voltage, respectively, and the third voltage is a low voltage.

14. The semiconductor memory device of claim 11, further comprising a memory cell coupled to the data line pair, wherein the data line pair includes a bit line pair.

15. The semiconductor memory device of claim 12, further comprising a temperature sensor suitable for sensing the first and second temperature ranges, and generating a temperature flag signal corresponding to the sense result, wherein the controller generates the first to third control signals based on the temperature flag signal, an active signal and a precharge signal.

16. The semiconductor memory device of claim 11, the amplification period includes an initial period and a later period.

* * * * *